(12) United States Patent
Kao et al.

(10) Patent No.: US 6,338,361 B2
(45) Date of Patent: *Jan. 15, 2002

(54) APPARATUS WITH A CHECK FUNCTION FOR CONTROLLING A FLOW RESISTANCE OF A PHOTORESIST SOLUTION

(75) Inventors: Chung-Hsien Kao, Yun-Lin Hsien; Ying-Ming Cheng, Kao-Hsiung Hsien; Li-Chung Lee, I-Lan Hsien; Chia-Wen Cheng, Chang-Hua, all of (TW)

(73) Assignee: United Microelectronics Corp., Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/497,667

(22) Filed: Feb. 4, 2000

(51) Int. Cl.[7] .............................................. F16K 15/04
(52) U.S. Cl. ................. 137/512; 137/533.11; 137/614.2
(58) Field of Search ................................ 137/511, 512, 137/512.5, 529, 533.11, 534, 613, 614.2

(56) References Cited

U.S. PATENT DOCUMENTS

| | | | | |
|---|---|---|---|---|
| 1,510,609 A | * | 10/1924 | Rush ........................... | 137/512 |
| 3,787,149 A | * | 1/1974 | Dane et al. ............. | 137/533.11 |
| 4,187,874 A | * | 2/1980 | Essebaggers ........... | 137/533.11 |
| 4,282,897 A | * | 8/1981 | de Mey, II ............. | 137/533.11 |
| 4,601,409 A | * | 7/1986 | DiRegolo ....................... | 222/1 |
| 4,846,218 A | * | 7/1989 | Upchurch .............. | 137/533.11 |
| 5,368,556 A | * | 11/1994 | Lecuyer ....................... | 137/529 |
| 6,071,094 A | * | 6/2000 | Yu et al. .................. | 417/555.1 |

* cited by examiner

*Primary Examiner*—Michael Powell Buiz
*Assistant Examiner*—Ramesh Krishnamurthy
(74) *Attorney, Agent, or Firm*—Winston Hsu

(57) ABSTRACT

The present invention provides a flow-control apparatus with a check function for controlling the flow resistance of a photoresist solution. The apparatus is connected to a photoresist supply device, the photoresist supply device comprising a tank for storing the photoresist solution, a pipe partially submerged in the photoresist solution in the tank to transport the photoresist solution, and a pump for drawing the photoresist solution from the tank. The apparatus comprises a housing and a sphere. The housing comprises a chamber, a top opening positioned at the top of the chamber, and a bottom opening positioned at the bottom of the chamber, wherein the top opening can be mated to an end of the pipe or to a bottom opening of another apparatus. The sphere is moveably set inside the chamber of the housing and increases the flow resistance of the photoresist solution. The number of apparatuses mounted in series with the end of the pipe can be changed to control the flow resistance of the photoresist solution through the pipe when drawing the photoresist solution from the tank.

10 Claims, 4 Drawing Sheets

APPARATUS WITH A CHECK FUNCTION FOR CONTROLLING A FLOW RESISTANCE OF A PHOTORESIST SOLUTION

BACKGROUND OF THE INVENTION

1. Field of the Invention

The present invention relates to an apparatus for controlling a flow resistance of a photoresist solution, and more particularly, to an apparatus with a check function for controlling a flow resistance of a photoresist solution.

2. Description of the Prior Art

In a lithographic process, electrical patterns are formed by performing exposure and development processes to a photoresist that has been coated onto the surface of a semiconductor wafer. The photoresist solution is drawn from a storage tank, transported via pipes to a nozzle and then sprayed onto the surface of the semiconductor wafer during the coating process. The viscosity of the photoresist solution varies from one storage tank to another as photoresist solutions of different viscosities are required for different manufacturing conditions. The change of viscosity affects the flow rate of the photoresist solution. These changing flow rates of the photoresist solution cause disproportionate coatings of photoresist onto the surface of the semiconductor wafer and adversely affect the yield of the subsequent fabrication process. Hence, it is important to control the flow resistance of the photoresist solution so as to transport the photoresist solution with a substantially constant pressure.

Please refer to FIG. 1. FIG. 1 is a schematic diagram of a photoresist solution supply device 10 according to the prior art. The photoresist solution supply device 10 comprises a tank 12 for storing the photoresist solution, a pipe 14 partially submerged in the photoresist solution in the tank 12 to transport the photoresist solution, a buffer tank 16 connected to the pipe 14 to remove bubbles from the photoresist solution, a pump 24 connected to the buffer tank 16 to draw the photoresist solution from the buffer tank 16, a nozzle 34, a bellow 26 connected to the pump 24, and an air cylinder 28 connected with the bellow 26. The pump 24 has compression and extension cycles, and pumps photoresist to the nozzle 34 on the compression cycle. The bellow 26 is air-powered and delivers the mechanical motion required to drive the pump 24. The air cylinder 28 comprises two valves 30, 32 and the to-and-fro movement of the bellow 26 is generated by compressed air flowing into the air cylinder 28 from the different valves 30, 32.

The buffer tank 16 comprises an inlet 18 on its top that is connected to the pipe 14, an outlet 22 on its bottom, and a vent 20 set at the top of the buffer tank 16 to vent bubbles from the photoresist solution. When the photoresist solution is introduced into the buffer tank 16, the bubbles in the photoresist solution accumulate in the top of the buffer tank and are vented through the vent 20 to prevent bubbles from interfering with the photoresist coating on the surface of the semiconductor.

To move the photoresist solution from the tank 12 to the nozzle 34, compressed air flows into the air cylinder 28 from the valve 32. This causes the bellow 26 to pull on the pump 24, which extends the pump 24 and causes it to draw photoresist from the tank 12. Then, compressed air flows into the air cylinder 28 from the valve 30. This causes the bellow 26 to push on the pump 24, compressing it and forcing the photoresist solution from the pump 26 to the nozzle 34. The buffer tank 16 draws photoresist solution from the tank 12 through the pipe 14 to replace the photoresist solution drawn by the pump 24. When the tank 12 runs out of photoresist solution, the pipe 14 is extracted from the tank 12 and inserted into a new tank. During this change, the photoresist solution in the pipe 14 drains out and air flows in. When the pipe 14 is inserted into the new tank, bubbles form in the photoresist solution. These bubbles are coated onto the surface of the semiconductor wafer together with the photoresist solution, degrading the quality of the photoresist coating process.

The viscosity of the photoresist solution can vary from one tank to another as photoresist solutions with differing viscosities are required by various manufacturing conditions. The change of viscosity affects the volume of photoresist solution transported into the pump 24, and may also cause bubbles to form in the photoresist solution. If the viscosity of the photoresist solution in the new tank is less than that of the previous tank, and the pump 24 draws the photoresist solution at the same speed, the volume of the photoresist solution drawn into the pump 24 will increase, leading to waste of the photoresist solution. If the flow speed of the photoresist solution drawn into the pump 24 is too great, bubbles will form in the photoresist solution. Therefore, the driving pressure of air forced into the air cylinder 28 must be changed to prevent the formation of bubbles in the photoresist solution. The optimum driving pressure, however, is arrived at through trial and error. The transport of photoresist solution to the nozzle 34 may not go smoothly during the trial and error process. This leads to uneven coatings of photoresist and decreases the quality of the coating process.

SUMMARY OF THE INVENTION

It is therefore a primary objective of the present invention to provide a flow-control apparatus with a check function for controlling the flow resistance of a photoresist solution.

In a preferred embodiment, the present invention provides a flow-control apparatus with a check function for controlling the flow resistance of a photoresist solution. The apparatus is connected to a photoresist supply device, the photoresist supply device comprises a tank for storing the photoresist solution, a pipe partially submerged in the photoresist solution in the tank to transport the photoresist solution, and a pump for drawing the photoresist solution out of the tank, the apparatus comprising:

a housing comprising a chamber, a top opening positioned at the top of the chamber, and a bottom opening positioned at the bottom of the chamber; wherein the top opening can be mated to an end of the pipe or to a bottom opening of another housing;

a sphere moveably set inside the chamber of the housing, the sphere being used to increase the flow resistance of the photoresist solution;

wherein the number of the apparatuses mounted in series with the end of the pipe can be changed to control the flow resistance of the photoresist solution through the pipe when drawing the photoresist solution from the tank.

It is an advantage of the present invention that the present invention can prevent back-flow of the photoresist solution into the tank so that air cannot flow into the pipe during the changing of one tank for another. The present invention controls the flow resistance of the photoresist solution by changing the number of apparatuses connected to the pipe, the density of the sphere, the number of spheres in the housing and the size of the sphere. A checklist can be made that relates the viscosity of the photoresist solution with the number of apparatuses, the density of the sphere, the number of spheres and the size of the sphere so that the flow resistance of the photoresist solution through the pipe can be easily controlled, thereby increasing the quality of the coating process.

DETAILED DESCRIPTION OF THE PREFERRED EMBODIMENT

Figure 1:
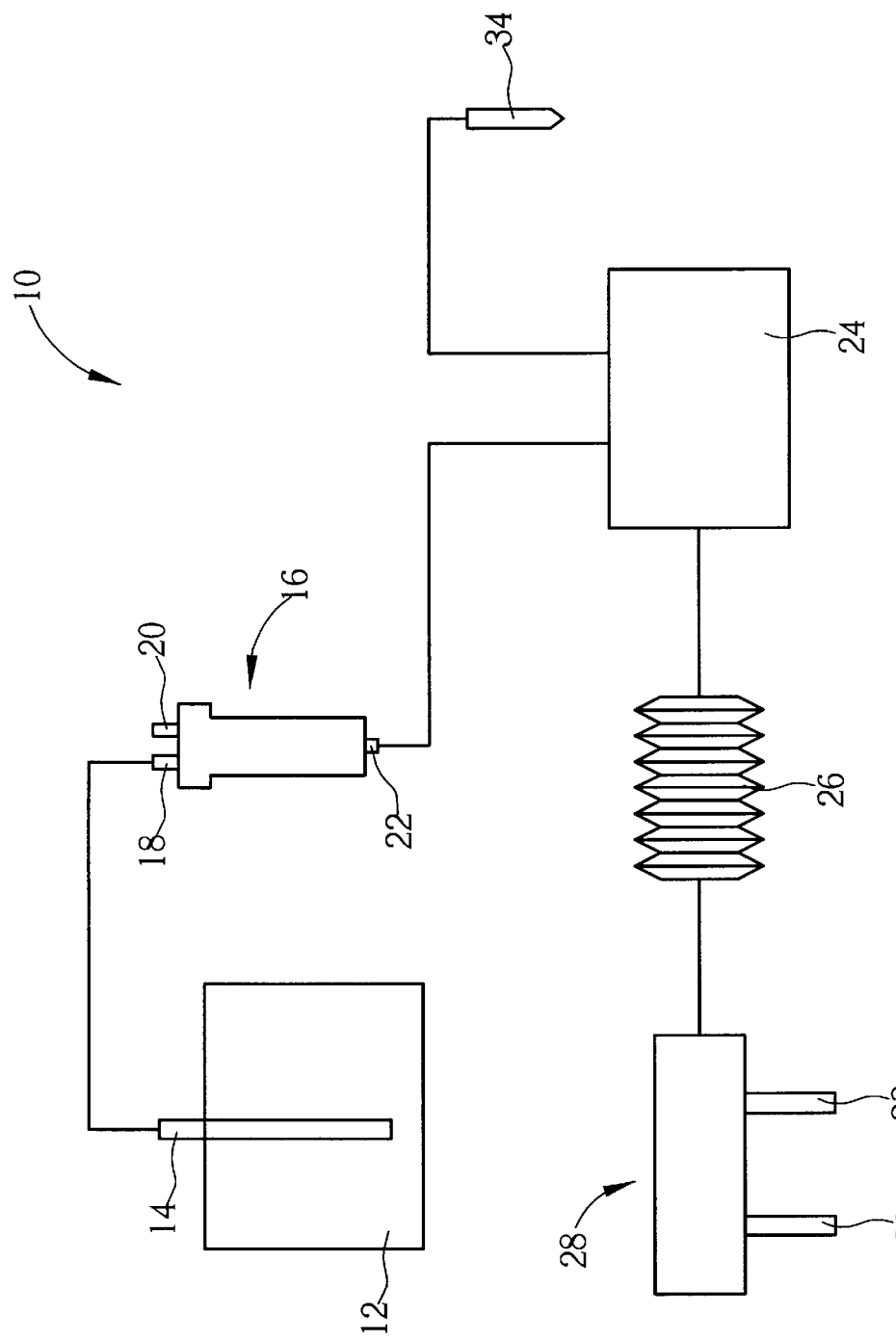
FIG. 1 is a schematic diagram of a photoresist solution supply device according to the prior art.
Figure 2:
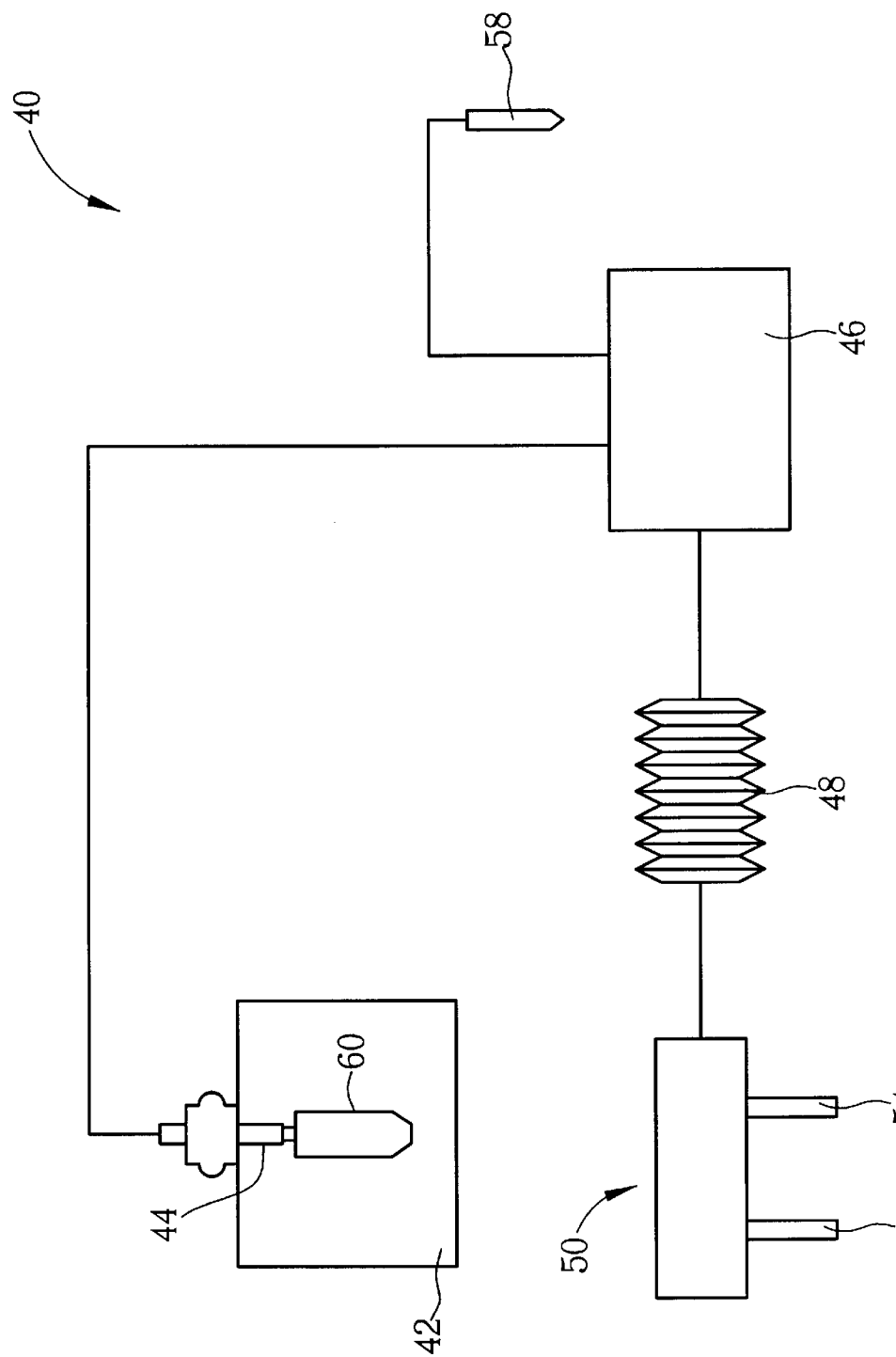
FIG. 2 is a schematic diagram of a photoresist solution supply device according to the present invention.

Please refer to FIG. 2. FIG. 2 is a schematic diagram of a photoresist solution supply device 40 according to the present invention. A flow-control apparatus 60 of the present invention is used to modify the flow resistance of the photoresist solution, and is connected to the photoresist supply device 40. The apparatus controls the volume of photoresist that is transported to a nuzzle 58. The photoresist solution supply device 40 comprises a tank 42 for storing the photoresist solution, a pipe 44 partially submerged in the photoresist solution in the tank 42 to transport the photoresist solution, a pump 46 for drawing the photoresist solution out of the tank 42, a bellow 48 connected with the pump 46 to drive the pump, and an air cylinder 50 connected with the bellow 48 for powering and controlling the bellow 48. The air cylinder 50 comprises two valves 52, 54 and the to-and-fro movement of the bellow 48 results from pressurized air being introduced into the air cylinder 50 through the valves 52, 54. The pipe 44, submerged in the photoresist solution, is substantially vertical.

Figure 3:
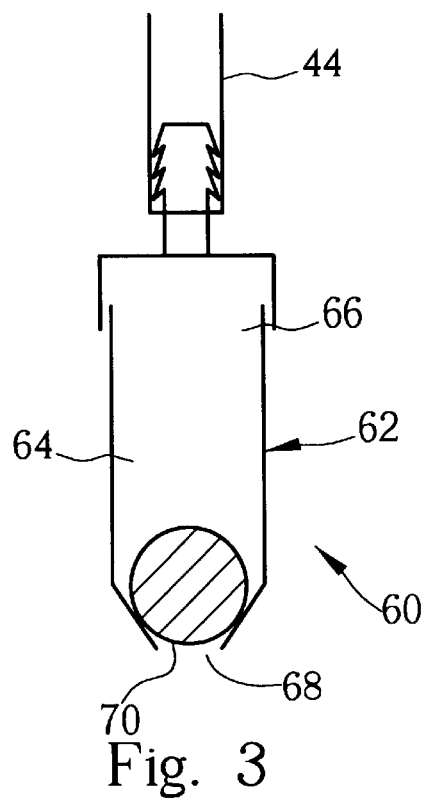
FIG. 3 is a sectional diagram of an apparatus for controlling the flow resistance according to the present invention.

Please refer to FIG. 3. FIG. 3 is a schematic diagram of the flow-control apparatus 60 for controlling the flow resistance of the photoresist solution according to the present invention. The apparatus 60 comprises a housing 62 and a sphere 70 made of steel. Although steel is disclosed here as an example, it should be understood that other materials may also be used to form the sphere 70. The housing 62 comprises a chamber 64, a top opening 66 positioned at the top of the chamber 64, and a bottom opening 68 positioned at the bottom of the chamber 64. The top opening 66 can be mated to an end of the pipe 44 or to the bottom opening of another flow-control apparatus. The sphere 70 is moveably set inside the chamber 42 of the housing 62, and it increases the flow resistance of the photoresist solution.

To move photoresist from the tank 42 to the nozzle 48, pressurized air flows into the air cylinder 50 from the valve 54 and causes the bellow 48 to extend. This draws the photoresist solution out of the tank 42 and into the pump 46. Pressurized air then flows into the air cylinder 50 from the valve 52 and causes the bellow 48 to contract. This forces the photoresist solution to flow from the pump 46 to the nozzle 58.

As the pump 46 draws the photoresist solution from the tank 42, the sphere 70 moves upward. The photoresist solution flows through the bottom opening 68, the chamber 64, the top opening 66, and then into the pipe 44. When the pump 46 stops drawing photoresist solution, the sphere 70 drops down and chokes the bottom opening 68. This prevents back-flow of photoresist solution into the tank 42. When the tank 42 runs out of photoresist, the pipe 44 is extracted from the tank 42 and inserted into a new tank. During this change, because of the choking action of the sphere 70, the photoresist solution in the pipe 44 does not flow out and air does not flow in. Consequently, the formation of bubbles is avoided.

Figure 4:
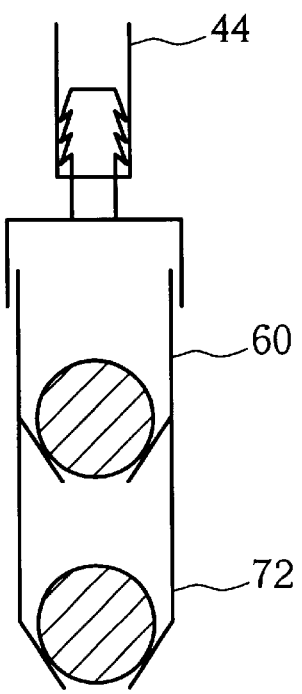
FIG. 4 is a sectional diagram of apparatuses in series for controlling the flow resistance according to the present invention.

Please refer to FIG. 4. FIG. 4 is a schematic diagram of flow-control apparatuses 60 in series with a flow-control apparatus 72 according to the present invention. Because the top opening 66 of the apparatus 60 can be mated to the end of the pipe 44 or to the bottom opening of another apparatus, the number of apparatuses 60 mounted in series with the end of the pipe 44 can be changed to control the flow resistance of the photoresist solution through the pipe 44 when drawing the photoresist solution from the tank 42. When the photoresist solution is exchanged for a new photoresist solution with a lesser viscosity, an apparatus 72, or more than one apparatus, can be mounted to the bottom opening 68 of the apparatus 60 to increase the flow resistance of the new photoresist so that it equals the flow resistance of the previous photoresist through the single apparatus 60. The pump 46 can then draw the new photoresist solution from the tank 42 with a predetermined pressure without changing the driving pressure of air delivered to the air cylinder 50, and the photoresist solution flows through the pipe 44 with a constant flow rate.

Alternatively, the sphere 70 can be replaced with another sphere with a different density to compensate for the changed viscosity of the new photoresist solution. For example, when using a less viscous solution, a new sphere 70 with a greater density can replace the old sphere in the chamber 64, and thus ensure a constant flow resistance for both types of photoresist solution. In this manner, bubble-formation due to an excessive flow rate of the solution is avoided, without needing to adjust the operating pressure of the pump 46.

Figure 5:
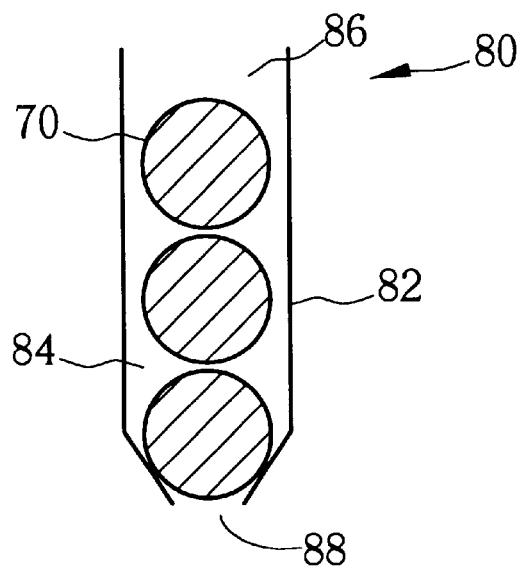
FIG. 5 is a diagram of an apparatus with a plurality of spheres for controlling the flow resistance according to the present invention.

Please refer to FIG. 5. FIG. 5 is a schematic diagram of another embodiment of a flow-control apparatus 80 according to the present invention. The housing 82 of the apparatus 80 can be replaced by a larger one that holds a plurality of spheres 70 to increase the flow resistance of the photoresist solution. FIG. 5 shows three spheres 70 moveably stacked inside the chamber 84 of the housing 82. These spheres are used to increase the flow resistance of the photoresist solution through the pipe 44 when drawing the photoresist solution from the tank 42. Although FIG. 5 depicts three spheres in the housing, it should be understood that the chamber 84 is designed to allow more than three spheres to be stacked to achieve the required flow resistance.

As in the above art, when the pump 46 draws the photoresist solution from the tank 42, the spheres 70 move upward and the photoresist solution flows through the bottom opening 88. It then flows through the chamber 84, the top opening 86 of the housing 82, and into the pipe 44. If the pump 46 stops drawing photoresist solution from the tank 42, the drop in pressure will cause one of the spheres 70 to move downward and choke the bottom opening 88. This prevents a back-flow of photoresist solution into the tank 42.

Figure 6:
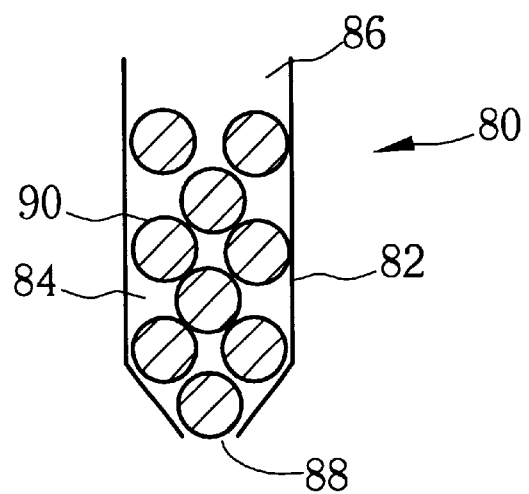
FIG. 6 is a diagram of an apparatus with a plurality of smaller spheres for controlling the flow resistance according to the present invention.

Please refer to FIG. 6. FIG. 6 is a schematic diagram of the apparatus 80 using smaller spheres 90 according to the present invention to achieve the proper flow resistance. There are nine spheres 90 moveably stacked inside the chamber 84 of the housing 82. They are used to increase the flow resistance of the photoresist solution through the pipe 44 when drawing the photoresist solution from the tank 42. Again, the depiction of nine spheres is arbitrary. More or less may be used to achieve the required flow resistance. As the pump 46 draws the photoresist solution from the tank 42, the spheres 90 move upward and the photoresist solution flows through the bottom opening 88. It then flows into the chamber 84, through the top opening 86 of the housing 82, and into the pipe 44. When the pump 46 stops drawing the photoresist solution from the tank 42, one of the spheres 90 will choke the bottom opening 88 to prevent back-flow of the photoresist solution into the tank 42.

Replacing the spheres 70 with the smaller spheres 90 enables the flow resistance of the photoresist solution to be controlled more precisely. If there is not a dramatic change in the viscosity of the photoresist solution, adding a sphere 70 to the chamber 84 of the housing 82, or removing one, can result in an over-adjustment. That is, the flow resistance may be excessively increased by adding a sphere 70, or excessively decreased by removing a sphere 70. This problem is resolved by adding a proper number of smaller spheres 90 to the chamber 84 according to the viscosity of the photoresist solution. Consequently, the number of the spheres 90 inside the chamber 84 is chosen according to the viscosity of the photoresist solution so that the pump draws the photoresist solution from the tank 42 with a predetermined pressure and the photoresist solution flows through the pipe 44 with a constant flow rate. Similarly, the flow resistance of the photoresist solution can also be modified by replacing the spheres with those of a different density, as required by the viscosity of the photoresist solution.

Compared to the prior art problem of bubble-formation in a photoresist solution, the present invention prevents back-flow of the photoresist solution into the tank so that air can not flow into the pipe when changing holding tanks. The present invention controls the flow resistance of the photoresist solution by changing the number of flow-control apparatuses linked together in series with the pipe, by changing the density of the spheres used in the flow control apparatus, by changing the number of spheres used in the housing, and by changing the size of the spheres. A list can be made that relates the viscosities of the various photoresist solutions to the best arrangement of flow-control apparatuses to ensure a proper flow rate. This list could include the number of apparatuses linked together in series with the pipe, the density of the spheres used inside the apparatus, the number of spheres used for each apparatus, and the size of the spheres.

Skilled in the art will readily observe that numerous modifications and alterations of the device may be made while retaining the teachings of the invention. Accordingly, the above disclosure should be construed as limited only by the metes and bounds of the appended claims.

What is claimed is:

1. A flow-resistance-control apparatus with a check function for a photoresist solution, the apparatus being connected to a photoresist supply device, the photoresist supply device comprising a tank for storing the photoresist solution, a portion of a pipe partially submerged in the photoresist solution in the tank to transport the photoresist solution, and a pump for drawing the photoresist solution out of the tank, the apparatus comprising a number of housings and each housing comprising:

a chamber, a top opening positioned at the top of the chamber, and a bottom opening positioned at the bottom of the chamber; wherein the top opening can be mated to an end of the pipe or to a bottom opening of another housing; and a sphere moveably set inside the chamber;

wherein when the photoresist solution is exchanged for a new photoresist solution with a lesser viscosity, the number of housings connected in series is increased to provide a suitable increase in flow resistance of the new photoresist.

2. The apparatus of claim 1 wherein the portion of the pipe submerged in the photoresist solution is substantially vertical.

3. The apparatus of claim 2 wherein the sphere is set inside the chamber of the housing in an up-and-down movable manner; wherein as the pump draws the photoresist solution, the sphere moves upward and the photoresist solution flows through the bottom opening, the chamber, the top opening of the housing and then into the pipe; as the pump stops drawing photoresist solution, the sphere chokes the bottom opening to prevent back-flow of the photoresist solution into the tank.

4. The apparatus of claim 1 wherein the sphere is removably set inside the chamber of the housing; wherein the sphere is changeable with another sphere of a different density to compensate for a changed viscosity of a new photoresist solution.

5. The apparatus of claim 1 wherein the sphere is made of steel.

6. An flow-control apparatus with a check function for controlling a flow resistance of a photoresist solution, the apparatus being connected to a photoresist supply device, the photoresist supply device comprising a tank for storing the photoresist solution, a portion of a pipe partially submerged within the photoresist solution in the tank to transport the photoresist solution, and a pump for drawing the photoresist solution out of the tank, the apparatus comprising:

a housing comprising a chamber, a top opening positioned at the top of the chamber, and a bottom opening positioned at the bottom of the chamber; wherein the top opening can be mated to an end of the pipe;

a plurality of spheres inside the chamber of the housing, the spheres being used to increase the flow resistance of the photoresist solution;

wherein the number of spheres in the chamber is selected according to the viscosity of the photoresist solution so that the pump draws the photoresist solution from the tank with a predetermined pressure and the photoresist solution flows through the pipe with a constant flow rate.

7. The apparatus of claim 6 wherein the portion of the pipe submerged in the photoresist solution is substantially vertical.

8. The apparatus of claim 7 wherein the spheres are stacked inside the chamber of the housing in an up-and-down movable manner; wherein as the pump draws the photoresist solution from the tank, the spheres move upward and the photoresist solution flows through the bottom opening, the chamber, the top opening of the housing, and then into the pipe; when the pump stops drawing the photoresist solution from the tank, one of the spheres chokes the bottom opening to prevent back-flow of the photoresist solution into the tank.

9. The apparatus of claim 6 wherein the spheres are made of steel.

10. The apparatus of claim 6 wherein the spheres are stacked inside the chamber of the housing.

* * * * *